(12) United States Patent
Takamizawa et al.

(10) Patent No.: US 6,889,753 B2
(45) Date of Patent: May 10, 2005

(54) CAPILLARY TUBE HEAT PIPE AND TEMPERATURE CONTROLLING APPARATUS

(75) Inventors: Masayoshi Takamizawa, Kawasaki (JP); Takashi Kaneko, Kanagawa (JP)

(73) Assignee: TS Heatronics Co., Ltd., Yokohama (JP)

( * ) Notice: Subject to any disclaimer, the term of this patent is extended or adjusted under 35 U.S.C. 154(b) by 0 days.

(21) Appl. No.: 10/321,328

(22) Filed: Dec. 17, 2002

(65) Prior Publication Data

US 2003/0111212 A1 Jun. 19, 2003

(30) Foreign Application Priority Data

Dec. 19, 2001 (JP) ........................................ 2001-385606

(51) Int. Cl.[7] .............................................. F28D 15/00
(52) U.S. Cl. ............................ 165/104.21; 165/104.33; 165/104.26; 165/185; 361/700; 174/15.2; 257/715
(58) Field of Search ........................ 165/104.26, 104.21, 165/104.33, 80.4, 185; 361/700, 699; 257/714–716; 174/15.2

(56) References Cited

U.S. PATENT DOCUMENTS

| 4,724,901 | A | * | 2/1988 | Munekawa | ............ | 165/104.21 |
| 4,921,041 | A | * | 5/1990 | Akachi | ............ | 165/104.29 |
| 5,219,020 | A | | 6/1993 | Akachi | | |
| 5,507,092 | A | * | 4/1996 | Akachi | ............ | 29/890.03 |
| 5,845,702 | A | * | 12/1998 | Dinh | ............ | 165/104.21 |
| 6,026,890 | A | * | 2/2000 | Akachi | ............ | 165/104.26 |
| 6,269,865 | B1 | * | 8/2001 | Huang | ............ | 165/104.26 |
| 6,345,664 | B1 | * | 2/2002 | Katsui | ............ | 165/80.3 |
| 6,530,420 | B1 | * | 3/2003 | Takada et al. | ............ | 165/104.33 |
| 6,785,135 | B2 | * | 8/2004 | Ohmi et al. | ............ | 361/700 |
| 2004/0075181 | A1 | * | 4/2004 | Hara | ............ | 261/99 |
| 2004/0257768 | A1 | * | 12/2004 | Ohmi et al. | ............ | 361/700 |

FOREIGN PATENT DOCUMENTS

| JP | 63-49699 | * | 3/1988 | ............ | 165/177 |
| JP | 1-203893 | * | 8/1989 | ............ | 165/177 |
| JP | 04-190090 A | | 7/1992 | | |

OTHER PUBLICATIONS

Shin–ichi Nagata et al: "Heat Transport Characteristics of SEMOS Heat Pipe", the proceedings of the 38th National Heat Transfer Symposium of Japan, May 2001.

* cited by examiner

*Primary Examiner*—Terrell McKinnon
(74) *Attorney, Agent, or Firm*—Frishauf, Holtz, Goodman & Chick, P.C.

(57) ABSTRACT

A capillary tube heat pipe and the like are provided, in which is applicable for a case that a heat receiving portion is separated apart from a heat radiating portion, and a sufficient space for connecting the both portions does not exist. This capillary tube heat pipe (1) is provided with two turn portions (a heat receiving portion and a heat radiating portion) (3-1) and (3-2) at the both ends thereof and a straight portion (a heat transfer portion) (5) extending between the both turn portions (3), and has a closed loop structure in which both terminals of a single pipe are communicated. Since the heat transfer portion is made from two straight pipes (7) and (9), the straight portion (5) can be small in size.

28 Claims, 11 Drawing Sheets

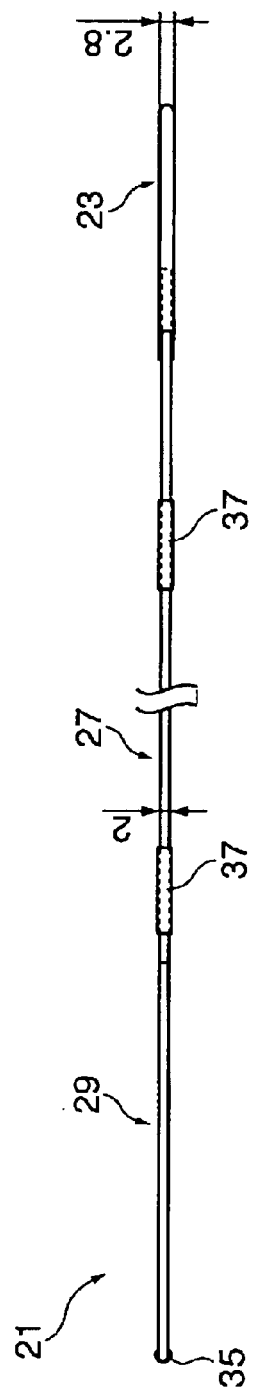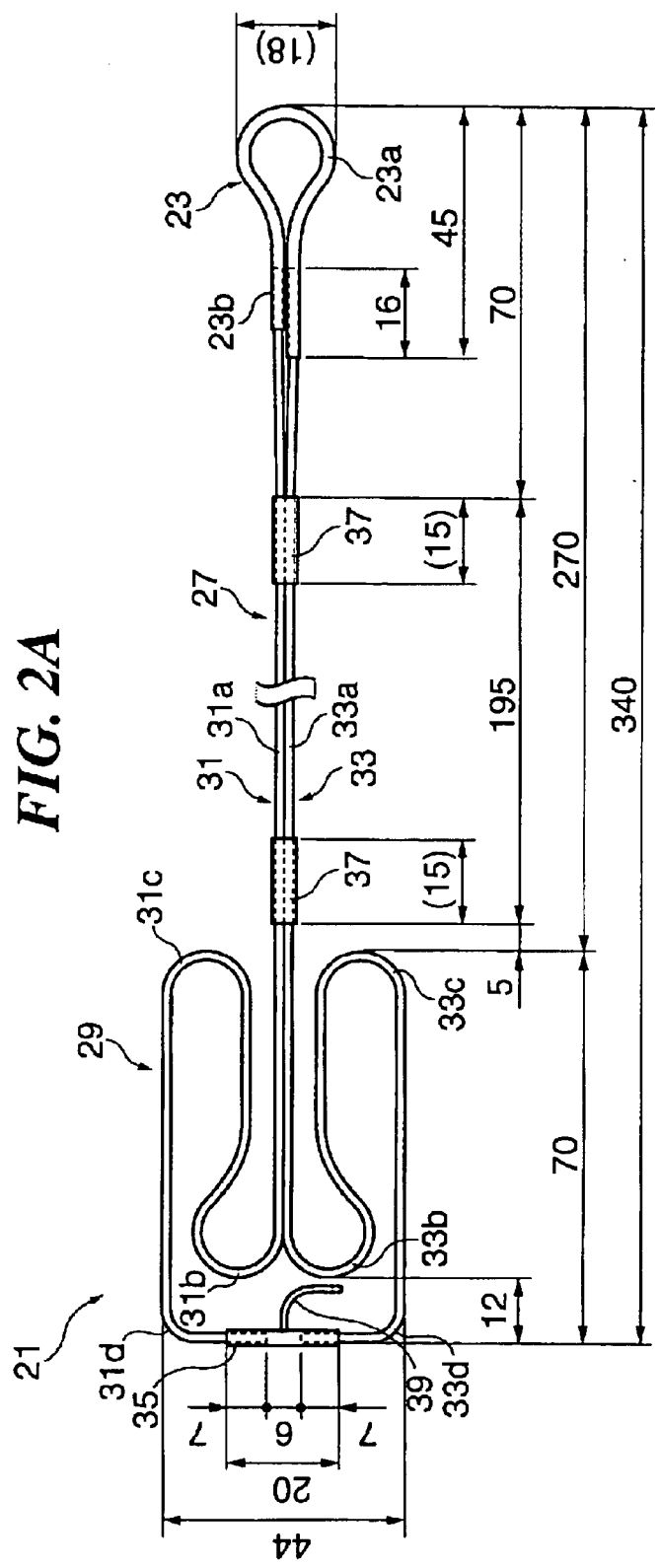

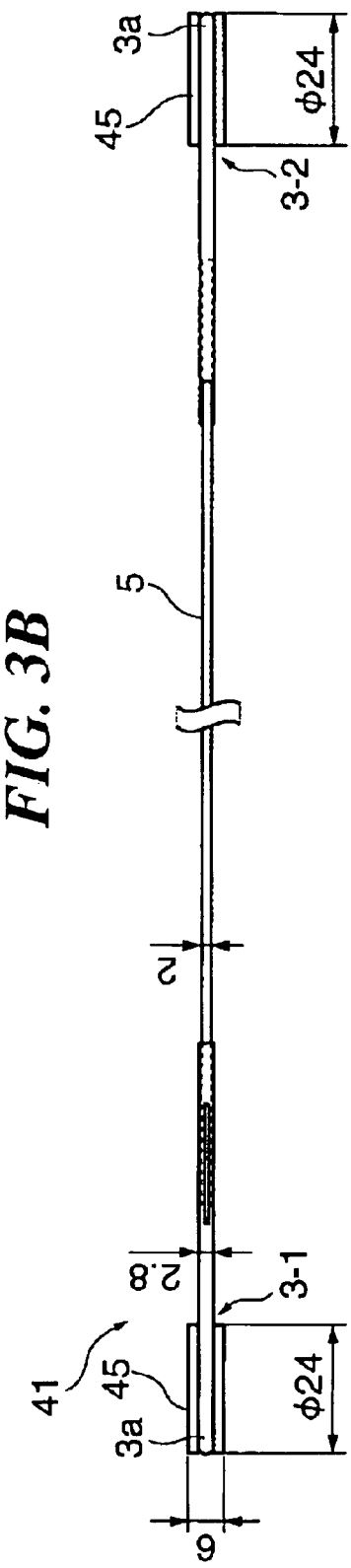
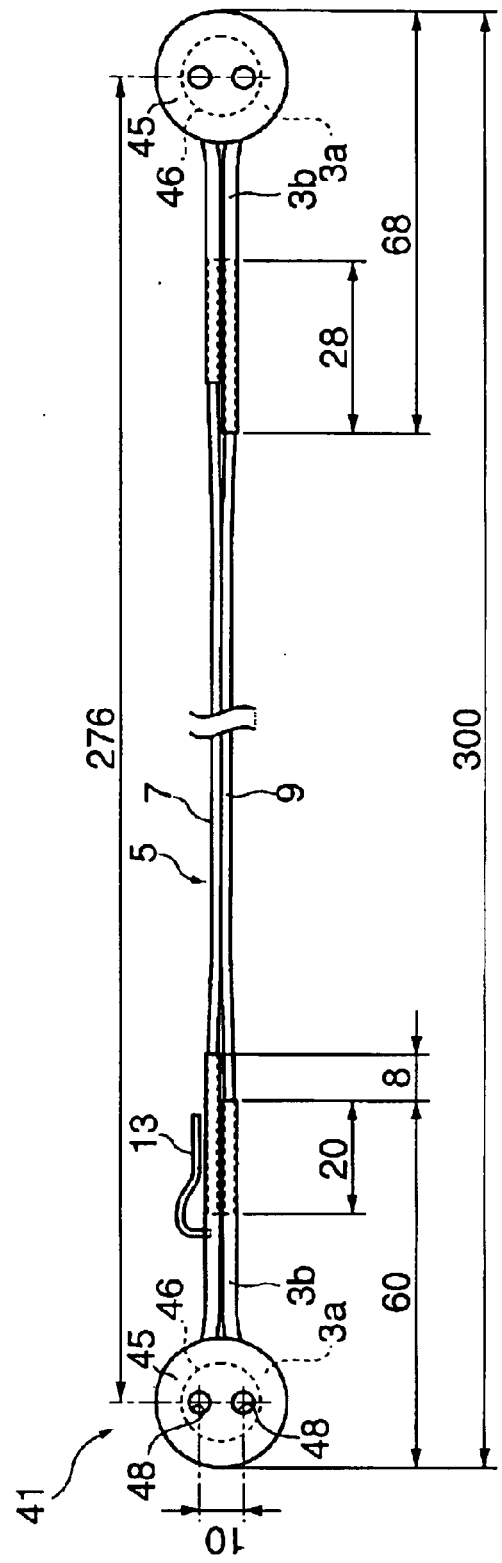

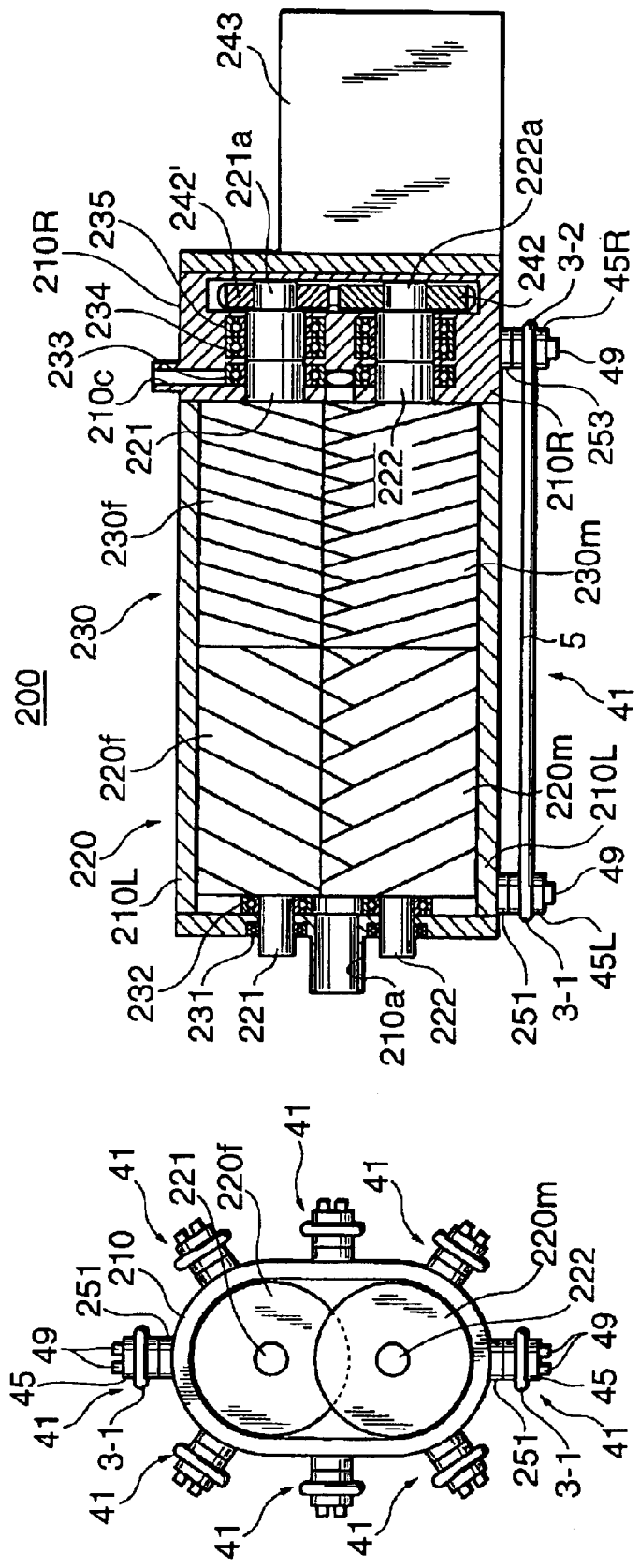

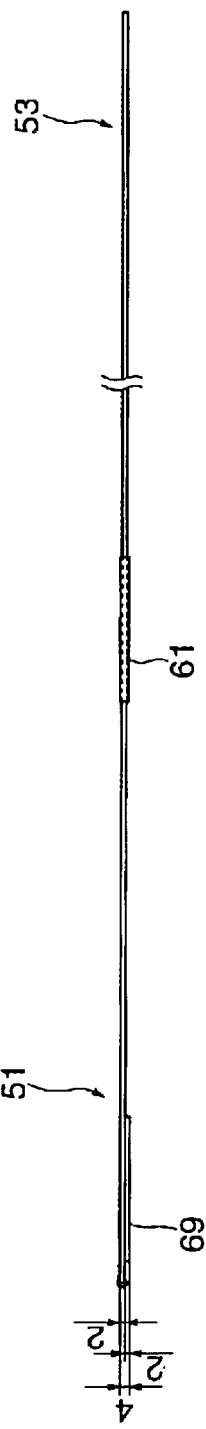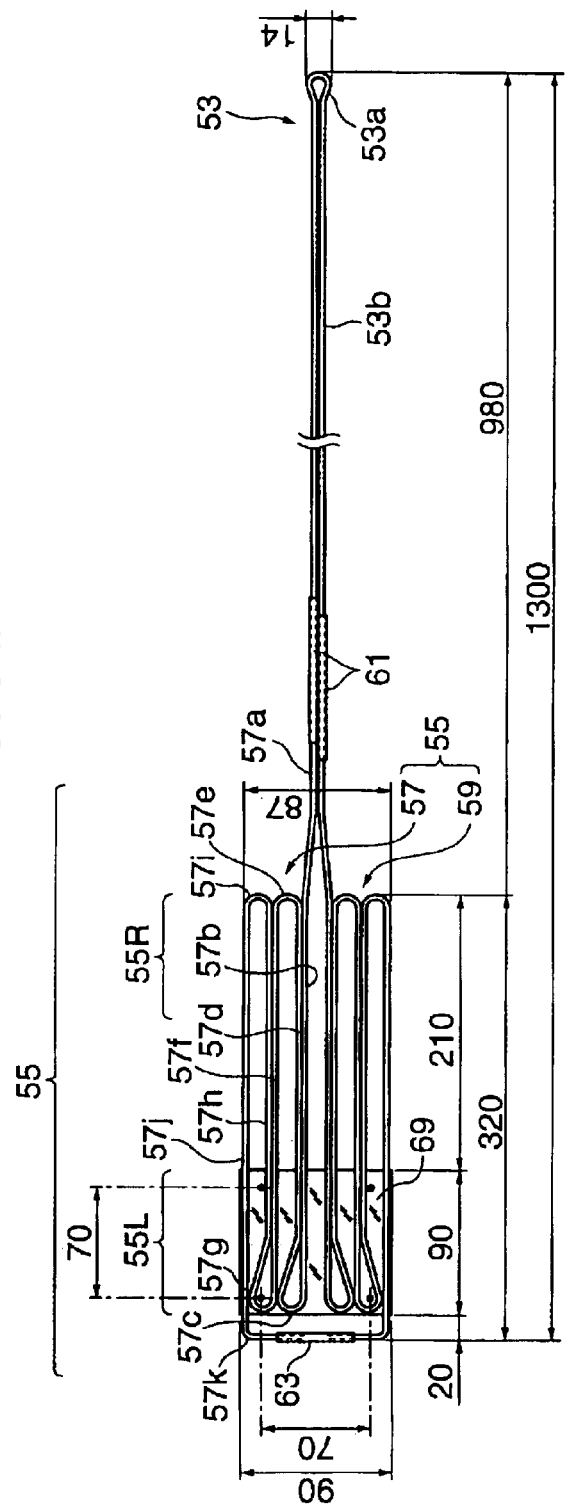

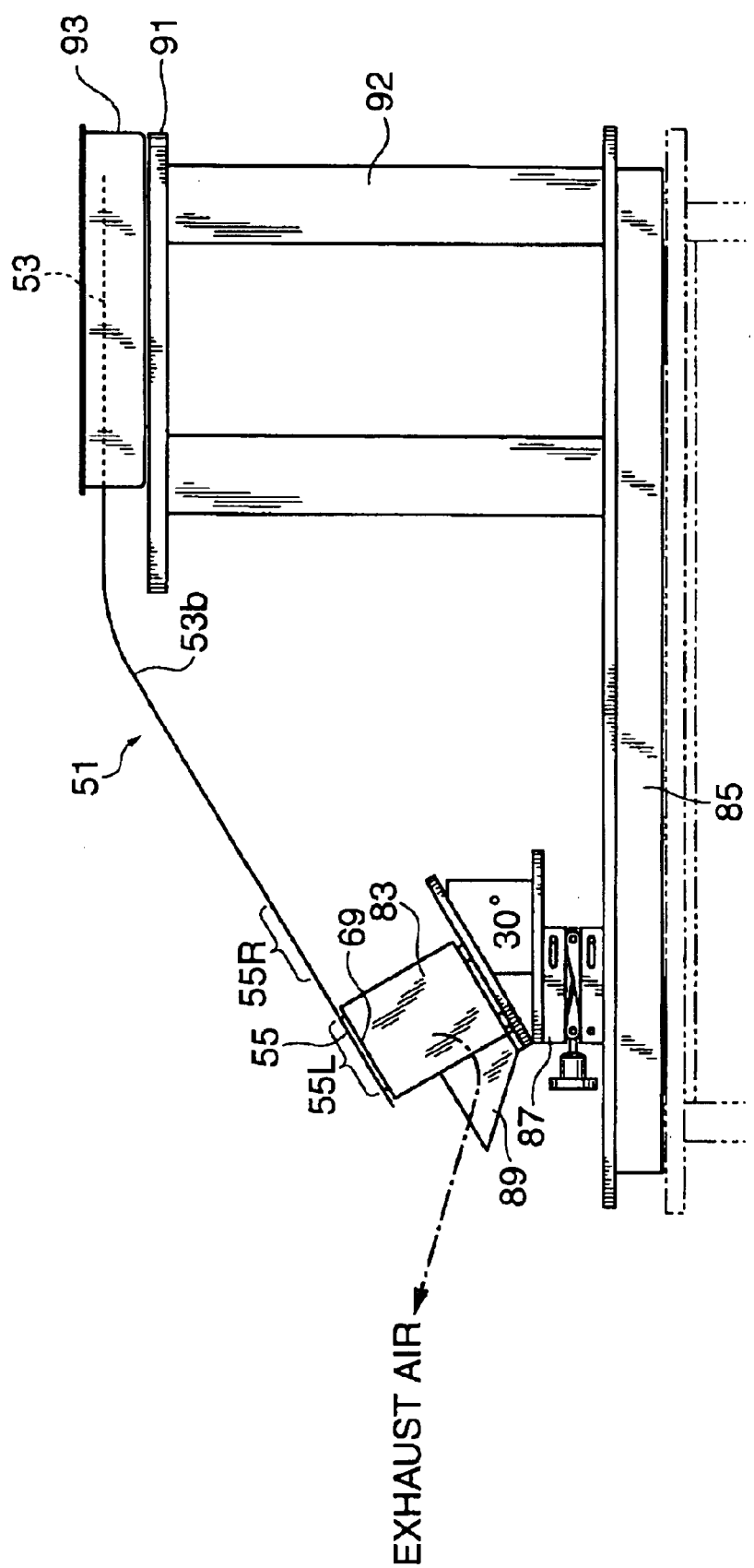

(PRIOR ART)

CAPILLARY TUBE HEAT PIPE AND TEMPERATURE CONTROLLING APPARATUS

FIELD OF THE INVENTION

The present invention relates to a heat pipe which radiates heat produced by a heat generating element, such as an electronic component, an internal combustion mechanism (an engine and the like), a driving mechanism of a vacuum pump, and a temperature controlling apparatus using the heat pipe. Particularly, it relates to a capillary tube heat pipe which can be used even when a heat receiving portion is separated apart from a heat radiating portion, and an enough space for connecting the both portions does not exist.

BACKGROUND OF THE INVENTION

Radiators have been generally employed for cooling heat generating elements, such as electronic components, internal combustion mechanisms and vacuum pumps. Among several types of the radiators, heat pipe radiators have been well known because of their high heat transfer performance. General heat pipe radiator is constructed mainly from a base plate on which the heat generating element is mounted, and a heat pipe of which a part (a heat receiving portion) is mounted on the base plate. The heat pipe has a sealed space inside of a hollow body which is vacuumed and then charged with a working fluid, such as water, butane and alcohol. Heat transferred to the base plate from the heat generating element is transferred to the heat receiving portion of the heat pipe which is contacted to the base plate, and then causes the working fluid in the pipe to be evaporated. The generated vapor is moved to a portion (a heat radiating portion) of the heat pipe on which the base plate is not mounted, and at that portion, the vapor radiates heat to be condensed to liquid. This phase change and the circulation of the working fluid in the sealed space cause the heat produced by the heat generating element to be dispersed. At the heat radiating portion, a fin may be attached to diffuse the heat efficiently.

As one type of the heat pipes, there is a meandering capillary tube heat pipe, in which a heat pipe is disposed to meander between a heat receiving portion and a heat radiating portion. The meandering capillary tube heat pipe is very useful because of its excellent heat transfer capacity. Such meandering capillary tube heat pipe is disclosed, for instance, in Japanese Laid-open Patent Publication No. Hei 4 (1992)-190090.

FIG. 11 is a partially cross sectional plan view showing a structure of a meandering capillary tube heat pipe disclosed in Japanese Laid-open Patent Publication No. Hei 4 (1992)-190090. The heat pipe 100 has the following characteristics.

(A) The both terminals of the capillary is connected each other so that the capillary is sealed off from the outside (closed loop type).

(B) One part of the capillary acts as a heat receiving portion H, and another part acts as a heat radiating portion C.

(C) The heat receiving portion H and the heat radiating portion C are alternately arranged, and between them the capillary meanders.

(D) In the capillary, a two-phase condensable fluid (working fluid) 101 is sealed.

(E) The capillary has a diameter less than a maximum diameter which allows the working fluid 101 to circulate or move in the capillary while being sealed the inside of the capillary.

A circulating flow of the working fluid 101 occurs in the heat pipe 100, and heat (hot heat) is transferred from the heat receiving portion to the heat radiating portion. The direction to which the working fluid flows depends on the attitude of the heat pipe 100.

When the heat pipe is horizontally arranged, vapor bubbles 103 generated at the heat receiving portion H are compressed at the heat radiation portion C so that the working fluid 101 flows to the heat radiating portion C closest to the heat receiving portion H, thus the working fluid 101 circulates in the arrow direction shown by the solid line in the figure. On the other hand, when the heat pipe is vertically arranged in the bottom heat mode, vapor bubble 103 generated at the heat receiving portion H move up through a connecting portion 105 in which a flow-resistance is the most smallest while the working fluid made by condensing the most of vapor bubbles 103 moves down in the meandering portion by gravity, whereby the working fluid 101 is circulated in the arrow direction shown by the broken line in the figure. On the other hand, in the case for transferring cold heat from a heat receiving portion to a heat radiating portion, the working fluid is condensed at the heat receiving portion and evaporated at the heat radiating portion by reverse manner of the above-described phenomena.

As for the heat transfer characteristic of such closed loop type meandering capillary tube heat pipe, it is found that the heat pipe, in which a liquid (R141b) having a small viscosity coefficient is employed, can exhibit an enough heat transfer capacity even if the inner diameter of the capillary is decreased to 0.8 mm. (Refer to, for instance, "Heat Transport Characteristics of SEMOS Heat Pipe", Nagata, Nishio, Shirakashi, Baba, The proceedings of the 38$^{th}$ National Heat Transfer Symposium of Japan, (May 2001)). And, as for a initial vacuum at the manufacturing stage of the heat pipe, while a wick type heat pipe requires a high initial vacuum of about 0.010 mm Hg, the closed loop type meandering capillary tube heat pipe exhibits a sufficient heat transfer capacity in spite of requiring a low initial vacuum of about 60 mm Hg.

Also, according to the above reference, how the circulating flow is generated is examined by visualizing the motion of the vapor phase and the liquid phase of the working fluid. As the result, in the closed loop type heat pipe having two pairs of going and returning passages, three main vapor plugs and three main liquid plugs are alternately formed in the heat pipe, and growing and condensing these plugs associated with heating and cooling provides a power for generating the circulating flow between the heat receiving portion and the heat radiating portion.

The heat pipe is also applied for cold heat transportation (a cooling apparatus). In this case, a cold heat generator is attached to the heat receiving portion of the heat pipe, and then cold heat produced from the cold heat generator is transferred to the heat receiving portion of the heat pipe, and to the heat radiating portion through the heat transfer portion to be finally radiated. Here, when an object to be cooled is attached to the heat radiating portion, the cold heat produced from the cold heat generator is transferred to the object through the heat pipe, and cools the object.

By the way, earlier studies has not proposed the constitution of the apparatus when the meandering capillary tube heat pipe is used under a condition in which a heat receiving portion is separated apart from a heat radiating portion, and an enough space for connecting the both portions does not exist. And, the above Nagata's paper describes that a heat transfer is easily carried out by generating a moving power for a circulating flow in the case of a closed loop type heat pipe having two pairs of going and returning passages. However, it does not describe the case of a closed loop type heat pipe having one pair of going and returning passages.

SUMMARY OF THE INVENTION

The object of the present invention is therefore to provide a heat pipe and a temperature controlling apparatus which can be used even when a heat receiving portion is separated apart from a heat radiating portion, and an enough space for connecting the both portions does not exist.

In order to solve the above-mentioned problems, a capillary tube heat pipe is provided with a heat receiving portion, a heat radiating portion and a heat transfer portion connecting said heat receiving portion and said heat radiating portion, and the heat pipe comprising a capillary tube which forms a closed loop as the whole; wherein said heat transfer portion is constructed from only one pair of going and returning passages.

By constructing the heat transfer portion from only one pair of going and returning passages, the heat transfer portion can be small, thus enabling to transfer heat even though the heat receiving portion is separated apart from the heat radiating portion by a small space. Here, the loop type capillary tube heat pipe which is constructed from only one pair of going and returning passages can exhibit an excellent heat transfer capacity. This fact is already confirmed by an experiment using such heat pipe. In this invention, a "heat" contains both of hot heat and cold heat, and the heat receiving portion of the heat pipe means a portion from which the heat to be transferred is generated.

In the present invention, it is preferable that said heat receiving portion and/or said heat radiating portion is constructed from a meandering capillary tube (a meandering turn portion) having a plurality of turnings.

Hereby, since the surface areas of the heat receiving portion and the heat radiating portion become larger, the heat transfer capacity may be bigger.

In the present invention, it is preferable that said meandering turn portion is heated or cooled at one turn end side and is cooled or heated at another turn end side so as to cause a working fluid in said meandering turn portion to be evaporated and condensed, thereby increasing a flow force of the working fluid in said meandering turn portion.

By increasing a flow force of the working fluid in the heat receiving portion and/or the heat radiating portion, the original flow force of the working fluid between the heat receiving portion and the heat radiating portion associated with evaporation and condensation of the working fluid is increased, thereby increasing the flow force of the working fluid in the whole capillary tube heat pipe (called as booster effect). Hereby, a considerable quantity of the working fluid can be flowed for a long distance so that a heat transporting capacity can be increased and a heat transportable distance can be lengthened.

In the present invention, it is preferable that at said heat receiving portion and/or said heat radiating portion, a high heat conductive member (a boss) which transmits heat conduction between the capillary tube and an object to be heated or an object to be cooled is mounted, said boss is provided with a groove in which the capillary tube of said heat receiving portion and/or said heat radiating portion is embedded.

By intervening the high heat conductive member, a heat conductivity between the heat receiving portion and/or the heat radiating portion of the heat pipe and an object to be heated or an object to be cooled (a heat receiving portion and a heat radiating portion) becomes larger (since the contact area becomes larger), so that the heat can be effectively transferred to the portion from which heat to be transferred is generated (an object to be cooled in the case of hot heat, an object to be heated in the case of cold heat) to the portion from which the heat is radiated (an object to be heated in the case of hot heat, an object to be cooled in the case of cold heat). And, by embedding the capillary into the groove of the boss, the heat conductivity between the capillary and the boss becomes larger. Also, the capillary does not deform even if a mechanical compressive stress is applied when the boss is mounted to the object to be heated or the object to be cooled.

The temperature controlling apparatus comprises a cold heat or a hot heat generating device (a heat generating device) such as a Peltier unit and a capillary tube heat pipe to be arranged between said heat generating device and an object to be cooled or an object to be heated, wherein said capillary tube heat pipe is provided with a heat receiving portion which is connected to said heat generating device, a heat radiating portion which is connected to said object to be cooled or said object to be heated, and a heat transfer portion connecting said heat receiving portion and said heat radiating portion, and the heat pipe comprising a capillary tube which forms a closed loop as the whole and, said heat transfer portion is constructed from only one pair of going and returning passages. Here, said heat generating device may be one of a device from which only cold heat is generated, or a device from which only hot heat is generated, or a device from which either of cold heat or hot heat is able to be generated.

The Peltier unit can be used for a cold heat generating device or a hot heat generating device by switching the current direction.

In the present invention, it is preferable that said heat receiving portion and/or said heat radiating portion is constituted from a meandering capillary tube (a meandering turn portion) having a plurality of turnings. And, it is preferable that said meandering turn portion is cooled or heated at one turn end side by said heat generating device, and is heated or cooled by circumference air at another turn end side. And, it is preferable that when said one turn end side is cooled by said heat generating device, said another turn end side is heated by medium (for instance, air) for radiating heat produced by a heat generating element of said heat generating device.

Hereby, the heat transportable capacity and the heat transportable distance are improved as compared with the case in which said meandering turn portion is not cooled or heated at both turn end sides. Here, the medium for radiating heat produced by a heat generating element of said heat generating device is described hereinafter referring to the case in which a Peltier element is used for the heat generating element. The Peltier element has a plate shape, and is provided with a cold heat generating face at one surface thereof and a heat radiating face at the opposite surface. In this case, one surface which is contacted with the heat receiving portion of the heat pipe becomes a thermal working surface (for instance, a cold heat generating face), and the opposite surface produces a counter thermal working (for instance, a hot heat radiating). When hot heat is radiated from the opposite surface, it is necessary to cool the opposite surface by a medium, such as air, in order to prevent the Peltier element from being damaged by excessive heating. In the present invention, the medium is intentionally used for an assistant heat source in order to increase the booster effect in the meandering turn portion.

BRIEF DESCRIPTION OF THE DRAWINGS

FIG. 1 is a drawing showing a structure of a capillary tube heat pipe according to the first embodiment of the present invention.

FIG. 2 is a drawing showing a structure of a capillary tube heat pipe according to the second embodiment of the present invention, FIG. 2(A) is a plan view and FIG. 2(B) is a side view.

FIG. 3 is a drawing showing a structure of a capillary tube heat pipe according to the third embodiment of the present invention, FIG. 3(A) is a plan view and FIG. 3(B) is a side view.

FIG. 5 is a drawing showing a screw-type vacuum pump adopting the capillary tube heat pipe of FIG. 3, FIG. 5(A) is a cross sectional side view and FIG. 5(B) is a cross sectional front view.

FIG. 6 is a drawing showing a structure of a capillary tube heat pipe according to the forth embodiment of the present invention, FIG. 6(A) is a plan view and FIG. 6(B) is a side view.

FIG. 7 is a drawing showing a structure of a temperature controlling apparatus according to the present invention as a cooling apparatus (a cold heat generating apparatus) and a cooling ability examination using the cooling apparatus.

FIG. 8 is a side view showing a structure of a temperature controlling apparatus according to the present invention as a heating apparatus (a hot heat generating apparatus).

DETAILED DESCRIPTION OF EMBODIMENT OF THE INVENTION

Figure 1B:
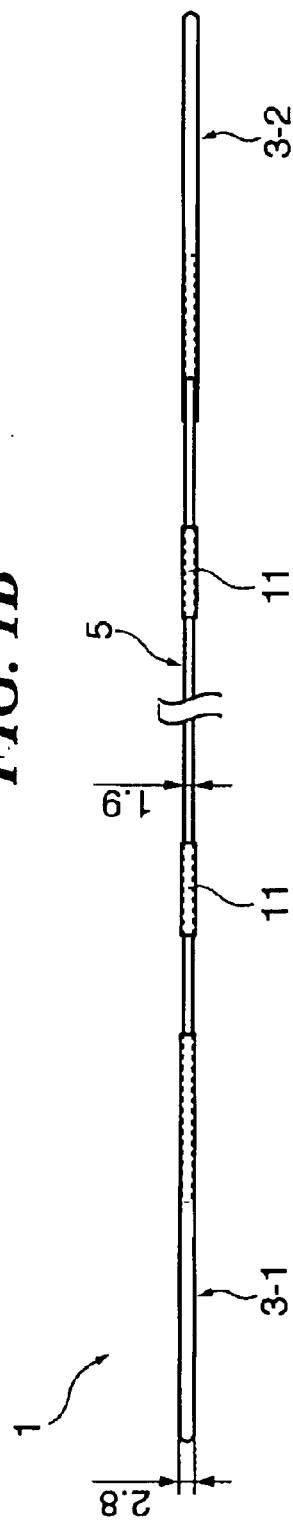
FIG. 1(A) is a plan view and FIG. 1(B) is a side view.

The preferred embodiments of the present invention will be described in detail with reference to the accompanying drawings. In the drawings, the left and right direction in figures is called the left and right direction.

Figure 1A:
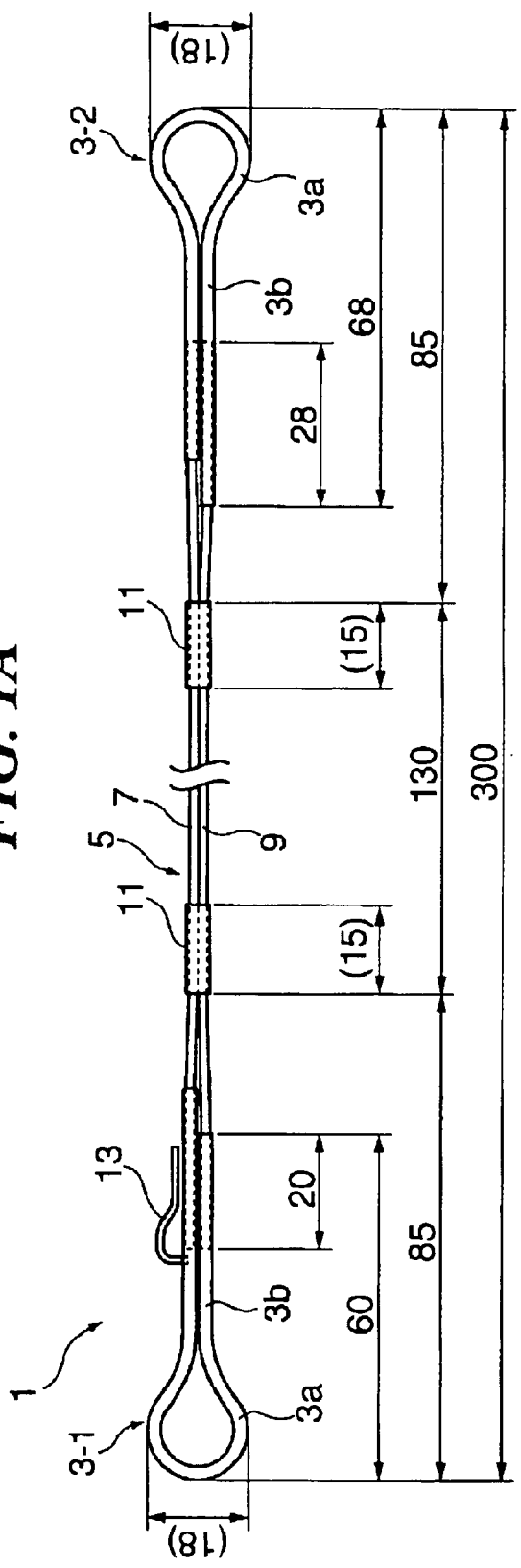

FIG. 1 is a drawing showing a structure of a capillary tube heat pipe according to the first embodiment of the present invention, FIG. 1(A) is a plan view and FIG. 1(B) is a side view. The sizes to be hereinafter described are examples.

This capillary tube heat pipe 1 is provided with two turn portions (a heat receiving portion and a heat radiating portion) 3-1 and 3-2 at the both ends thereof and a straight portion (a heat transfer portion) 5 extending between the both turn portions 3, and has a closed loop structure in which both terminals of a single pipe are communicated. The both turn portions 3-1 and 3-2 are made of high heat conductive material, such as copper.

Each of the turn portions 3 is made from a pipe having a length of 140 mm, an outer diameter of 2.8 mm and an inner diameter of 2.1 mm. The pipe is bent into a substantially circle shaped loop 3a having a diameter of 18 mm at an approximate center thereof. A proximal part 3b of the loop 3a is made from the straightly and adjacently extending parts of the pipe.

The straight portion 5 is made from two straight pipes 7 and 9 (made of stainless steel) each having a length of 220 mm, an outer diameter of 1.9 mm, and an inner diameter of 1.7 mm. The reason why the heat transfer portion is made of stainless steel having bad heat conductance is that it is preferable to suppress a heat exchange between the heat pipe and the outside thereof as small as possible. So, the heat transfer portion is sometimes called a heat insulation portion.

The both terminals of the pipes 7 and 9 are inserted and hermetically connected into the ends of the proximal parts 3b of the two turn portions 3 by soldering. Hereby, the straight portion 5 and the turn portions 3-1 and 3-2 are interconnected, and inner bore of the straight portion 5 and inner bores of the two turn portions 3-1 and 3-2 are communicated each other to form a closed loop. The length of an inserted part of the straight portion 5 into the proximal part 3b of the turn portion 3 is 20 mm at one terminal thereof, and is 28 mm at another terminal. Two pipes 7 and 9 of the straight portion 5 adjacently extend between both the turn portions 3-1 and 3-2, and is joined by heat resisting tapes 11 each having a width of 15 mm at two positions of 85 mm from both terminals. The entire length of the heat pipe 1 is 300 mm.

A reference numeral 13 in the figure denotes an inlet for pouring the working fluid into the inner bore of the heat pipe 1, which is sealed off after pouring.

In the capillary tube heat pipe 1, one of both turn portions 3 acts as a heat receiving portion, and another thereof acts as a heat radiating portion. And, the straight portion 5 acts as a heat transfer portion. Since the heat transfer portion is made from two straight pipes 7 and 9, the heat receiving portion and the heat radiating portion are connected by one pair of going and returning passages. In this embodiment, although a distance between both the turn portions 3-1 and 3-2 (that is, between the heat receiving portion and the heat radiating portion) is considerably long, that is about 220 mm, the heat pipe can exhibit a sufficient heat transfer capacity. And, since the straight portion 5 which connects both the turn portions 3-1 and 3-2 is small in size with a width of 3.8 mm and a height of 1.9 mm, the heat pipe can be arranged through a small space. Incidentally, even if the straight portion 5 would be bent on the way, a comparable heat transfer capacity can be obtained.

FIG. 2 is a drawing showing a structure of a capillary tube heat pipe according to the second embodiment of the present invention, FIG. 2(A) is a plan view and FIG. 2(B) is a side view.

The capillary tube heat pipe 21 has a substantially same structure as that of the heat pipe 1 shown in FIG. 1 except for a structure of one of the turn portions.

The capillary tube heat pipe 21 is provided with one turn portion 23 in the right end, a meandering turn portion 29 in the left end, and a straight portion 27 which connects both turn portions, and has a closed loop structure in which both terminals of a single pipe are communicated.

The one turn portion 23 is made from a pipe having a length of 100 mm, an outer diameter of 2.8 mm and an inner diameter of 2.1 mm. The pipe is bent into a substantially circle shaped loop 23a having a diameter of 18 mm at an approximate center thereof. A proximal part 23b of the loop 23a is made from the straightly and adjacently extending parts of the pipe. The one turn portion 23 is connected to the right end of the straight portion 27.

The left end of the straight portion 27 is followed by the meandering turn portion 29. The straight portion 27 and the meandering turn portion 29 are made from one pair of pipes 31 and 33 each having a length of 500 mm, an outer diameter of 2.0 mm and an inner diameter of 1.6 mm. The straight portion 27 is made from two straight pipe portions 31a and 33a. Following the straight pipe portions 31a and 33a, each of the pipes 31 and 33 is meanderingly bent to provide two turnings and one curve in the meandering turn portion 29, respectively. The first turnings 31b and 33b are provided by bending the pipes back in hairpin shape from the straight pipe portions 31a and 33a, respectively. And, the second turnings 31c and 33c are provided by bending the pipes outwardly back in semicircular shape in substantially parallel with the straight pipe portions 31a and 33a. Further, the curves 31d and 33d are provided by bending the pipes to perpendicular in ¼ circle shape. The left terminals of the pipes 31 and 33 are inserted and hermetically connected into both terminals of a connecting pipe 35 by soldering. Hereby, both pipes 31 and 33 are connected each other, and both inner bores thereof are fluidly communicated. The connecting pipe 35 has a length of 20 mm, an outer diameter of 2.8 mm and an inner diameter of 2.1 mm. And, the length of an inserted part of the meandering portion 29 into the connecting pipe 35 is 7 mm.

Thus, the meandering turn portion 29 is provided with a total of five turnings including four turnings 31b, 31c, 33b and 33c, and one turning formed by the curves 31d and 33d and the connecting pipe 35. The straight portion 27 has a length of about 230 mm, and the meandering turn portion 29 has a length of 70 mm and a width of 44 mm.

The right terminals of the two pipes 31 and 33 are inserted and hermetically connected into the proximal part 23b of the one turn portion 23 by soldering. Hereby, the straight portion 27 and the meandering turn portion 29, and the one turn portion 23 are interconnected, and the inner bore of the straight portion 27 and the meandering turn portion 29, and the inner bore of the one turn portion 23 are communicated. The lengths of inserted parts of the pipes 31 and 33 into the one turn portion 23 are about 16 mm. Then, the straight pipe portions 31a and 33a of the straight portion 27 are joined by two heat resistive tapes 37 each having a width of 15 mm at a position of 70 mm apart from the turn end of the one turn portion 23 and at a position of 75 mm apart from the turn end of the meandering turn portion 29. The entire length of the heat pipe 21 is 340 mm.

A reference numeral 39 in the figure denotes an inlet for pouring the working fluid, which is sealed off after pouring.

In the capillary tube heat pipe 21, one of the turn portion 23 or the meandering turn portion 29 acts as a heat receiving portion, and another thereof acts as a heat radiating portion. And, the straight portion 27 acts as a heat transfer portion. Since the heat transfer portion 27 is made from two straight pipe portions 31a and 33a, the heat receiving portion and the heat radiating portion are connected by one pair of going and returning passages. Either of one turn portion 23 or the meandering turn portion 29 may be used for either of the heat receiving portion or the heat radiating portion. Since the meandering turn portion 29 has a larger surface area than the one turn portion 23, it can be expected that the heat pipe 21 in this embodiment will have a excellent heat transfer capacity several times to several ten times as large as that of the capillary tube heat pipe 1 in FIG. 1.

In the capillary tube heat pipe 21 according to the present embodiment, the larger the number of turnings, the larger the heat receiving capacity or the heat radiating capacity. Therefore, when the number of turning is set in proportion to the quantity of heat generated from an object to be cooled or an object to be heated, a heat transfer apparatus having a optimum heat transfer capacity can be achieved. In the capillary tube heat pipe 21 according to the present embodiment, the heat transfer portion can have a maximum effective heat transfer length of about 1000 mm.

FIG. 3 is a drawing showing a structure of a capillary tube heat pipe according to the third embodiment of the present invention, FIG. 3(A) is a plan view and FIG. 3(B) is a side view.

Figure 4:
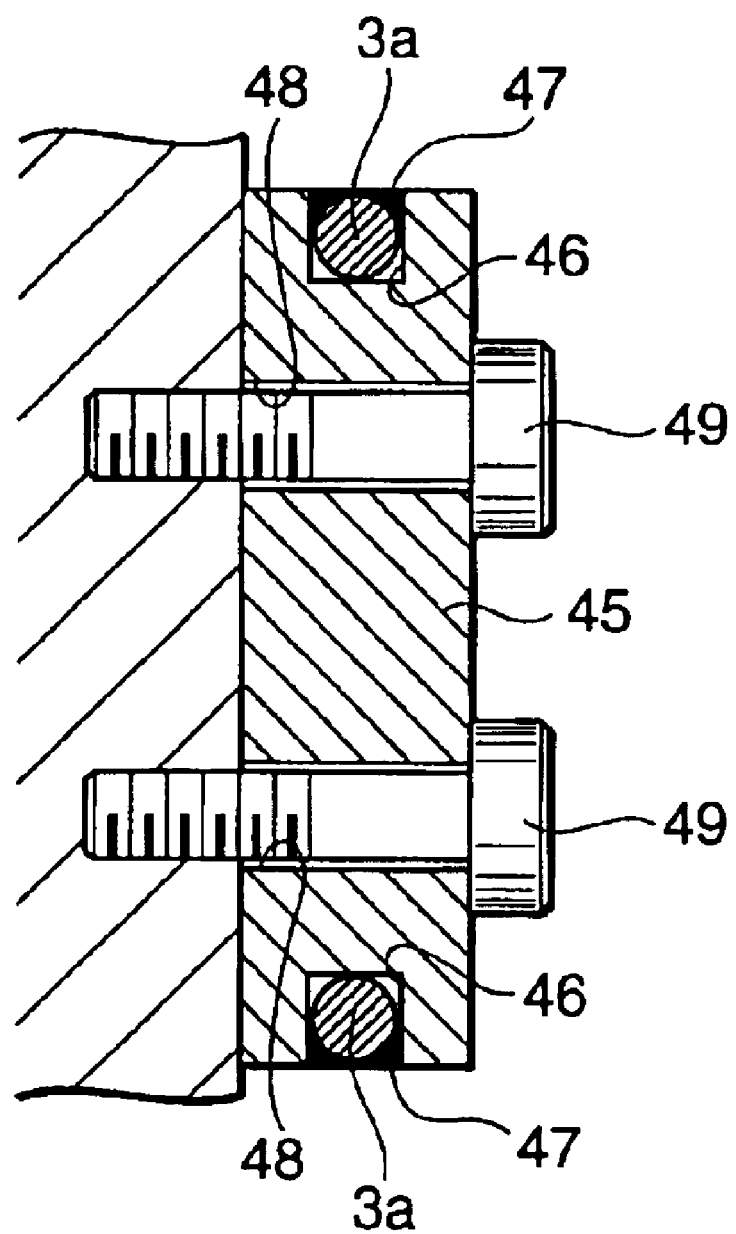
FIG. 4 is a partially cross sectional view showing the capillary tube heat pipe of FIG. 3.

FIG. 4 is a partially cross sectional view showing the capillary tube heat pipe of FIG. 3.

The capillary tube heat pipe 41 is provided with two bosses (heat conductive members) at the both turn portions 3-1 and 3-2 of the capillary tube heat pipe 1 of FIG. 1. In FIG. 3, each member having a same structure and action as that of the capillary tube heat pipe of FIG. 1 is shown with the same numeral as that of FIG. 1 and explanation is omitted. And, in FIG. 3, the tape 11 is omitted. Also, the heat pipes 1 in FIG. 1 and the heat pipe 21 in FIG. 2 may have no tapes 11 and 37, respectively. The size of each member and part is similar with that of FIG. 1.

At both turn portions 3-1 and 3-2, bosses (heat conductive members) 45 are mounted, respectively. Each boss 45 is made of high heat conductive material, such as copper, and has a disk shape having a diameter of 24 mm and a thickness of 6 mm, for instance. On the circumference surface of each boss 45, a groove 46 is formed, in which the pipe of the loop 3a is embedded. As shown in FIG. 4, the pipe of the loop 3a is firstly embedded with bending along the groove 46, and then solder 47 is flown into a space between the outside surface of the pipe of the loop 3a and the groove 46 to secure the pipe of the loop 3a and the boss 45. Hereby, the pipe of the loop 3a and the boss 45 can be secured with sufficient high heat conductivity.

At an inside of an end surface of the boss 45, two bores 48 are penetrated in the thickness direction. As shown in FIG. 4, the bosses 45 are mounted to a heat radiating portion and a heat receiving portion by using screws 49 passed into the bores 48 while being contacted with their large end surfaces. Therefore, contact area between the heat pipe and the heat receiving portion or the heat radiating portion increases so that the heat conductance becomes high, thereby providing an excellent heat transfer capacity. And, even when the screws 49 is firmly tightened at the mounting, large load by which the pipe may be deformed is not applied to the pipe so that disadvantageous effect for the circulation flow of the working fluid, caused by the deformation of the pipe, does not occur. Further, since two screws 49 are used for mounting the bosses 45, the bosses 45 (heat pipe) does not rotate with the screws 49 on tightening the screws 49, whereby the heat pipe is not damaged.

FIG. 5 is a drawing showing a screw-type vacuum pump adopting the capillary tube heat pipe of FIG. 3, FIG. 5(A) is a cross sectional side view and FIG. 5(B) is a cross sectional front view.

In a casing 210 of the screw-type vacuum pump 200, a main screw rotor 220 disposed at the left and a sub screw rotor 230 disposed at the right are stored. The main screw rotor 220 is constructed from a female screw rotor 220f and a male screw rotor 220m, and the sub screw rotor 230 is constructed from a female screw rotor 230f and a male screw rotor 230m. The male screw rotors 220m and 230m are mounted on a shaft 222, and the female screw rotors 220f and 230f are mounted on a shaft 221. Each shaft is rotationally mounted to the casing 210 by bearings 231, 232, 233, 234 and 235. The gear ratio of the main screw rotor 220 is different from that of the sub screw rotor 230. The casing 210 is provided with an inlet port 210a and an outlet port 210c. The inlet port 210a is disposed at the left end surface of the housing 210L in the left end side of each screw rotor. The outlet port 210c is disposed at the sidewall of the casing 210R in the right end side of each screw rotor.

At the right end 222a of the male screw rotor shaft 222, a timing gear 242 is mounted, which engages with a timing gear 242' mounted on the right end 221a of the female screw rotor shaft 221. And, the male screw rotor shaft 222 is connected to a rotating shaft (not shown) of a motor 243. When driving the motor 243, the male screw rotors 220m and 230m are rotated to allow the female screw rotors 220f and 230f to be rotated by engagement with the timing gears 242 and 242'.

On rotating the screw rotors 220 and 230, air is drawn from the inlet port 210a, and is compressed and transferred between both rotors, and finally discharged from the outlet port 210c.

In such vacuum pomp 200, by rotating the timing gears 242 and 242' driven by the motor 243, heat is easily generated at the casing 210R (as shown in the right in the figure), in which the timing gears 242 and 242' are stored. The temperature rise at the casing 210R may cause problems, such as decrease in the efficiency due to air leak. Accordingly, the casing 210 requires a cooling means. For the cooling means, the capillary tube heat pipe according to the present embodiment is provided.

The capillary tube heat pipe 41 is arranged to the casing 210 so that one boss 45L is mounted to a left platform 251 on the casing 210L, at which the inlet port 210a is formed, and another boss 45R is mounted to a right platform 253 on the casing 210R, in which the timing gears 242 and 242' are stored. The straight portion 5 extends between both platforms 251 and 253. The platforms 251 and 253 are made of highly heat conductive material, and acts as a heat receiving plate or a heat radiating plate. The platforms 251 and 253 are preferably formed with the casing 210. The boss 45L mounted at the inlet port 210a side becomes a heat radiating portion, and the boss 45R mounted at the timing gears 242 and 242' side becomes a heat receiving portion. Both bosses 45 of the capillary tube heat pipe are secured to the platforms 251 and 253 by two bolts 49, respectively. As shown in FIG. 5(B), a suitably number of the capillary tube heat pipes 41 is mounted on the outer surface of the casing 210.

On rotating the timing gears 242 and 242' by driving the motor 243, the temperature of the casing 210R in which the timing gears 242 and 242' are stored is raised to generate hot heat. The generated hot heat is received by the boss 45R via the platform 253, and is transferred to the boss 45L through the straight portion 5, and then to the casing 210L via the platform 251 to be finally radiated.

Here, the vacuum pump 200 is practically arranged so that the each axis of the rotors 220 and 230 extends in the gravity direction (the up and down direction), whereas FIG. 5(A) shows that the axis extends in the left and right direction.

In this vacuum pump 200, since a suitably number of the capillary tube heat pipe can be mounted by a simple process, such as the above described means using bolts, there is no necessity of a complicate process, such as embedding a heat pipe into a casing.

The capillary tube heat pipe can be applied for a V-shaped engine mounted on a motorcycle. The V-shaped engine has a side shape of V, and is provided with a front cylinder and a rear cylinder. And, it is disposed between a front wheel and a rear wheel of the motorcycle. The front cylinder, which is located in front side to the running direction, is easily exposed by air thereby to be air-cooled efficiency. On the contrary, the rear cylinder is shielded by the front cylinder due to the above described arrangement, whereby it is not exposed to enough air for cooling thereof. Then, the capillary tube heat pipe 41 according to the present embodiment is provided so that one boss 45 (the heat receiving portion) is located at the rear cylinder and another boss 45 (the heat radiating portion) is located at the front cylinder, whereby heat can be transferred from the rear cylinder to the front cylinder. Therefore, when the motorcycle runs for a long time continuously, overheat is hardly occurred in the engine. Further, the capillary tube heat pipe can be mounted by a simple process using bolts.

FIG. 6 is a drawing showing a structure of a capillary tube heat pipe according to the forth embodiment of the present invention, FIG. 6(A) is a plan view and FIG. 6(B) is a side view.

The capillary tube heat pipe 51 has a substantially same structure as that of the capillary tube heat pipe 21 of FIG. 2 except for having a longer length than the capillary tube heat pipe 21 of FIG. 2. And, the number of turning in the meandering turn portion is larger.

A straight portion 53b and one turn portion 53 are made from a pipe each having a length of 1700 mm, an outer diameter of 2.0 mm and an inner diameter of 1.6 mm. The pipe is bent into a substantially circle shaped loop 53a having a diameter of 14 mm at an approximate center thereof. From the loop 53a, the straight portions 53b are made from the straightly and adjacently extending parts of the pipe.

The meandering turn portion 55 is made from one pair of pipes 57 and 59 each having a length of 1700 mm, an outer diameter of 2.0 mm and an inner diameter of 1.6 mm. Each pipe is symmetrically arranged with respect to the center in the lengthwise of the capillary tube heat pipe 51. One terminals of the pipes 57 and 59 are connected each other via a connecting pipe 63, and the inner bores thereof are fluidly communicated. And, another terminals of the pipes 57 and 59 are connected to the both pipe terminals of the straight portion 53b via connecting pipes 61, and the inner bore of the meandering turn portion 55, and the inner bore of the one turn portion 53 and the straight portion 53b, are fluidly communicated. The lengths of inserted parts of the pipes 57 and 59 into the connecting pipes 61 and 63 are about 20 mm. Each of the pipes 57 and 59 is hermetically connected to each of the connecting pipes 61 and 63 by soldering. The connecting pipes 61 and 63 have a length of 60 mm, an outer diameter of 2.8 mm and an inner diameter of 2.1 mm.

Between both terminals of each of the pipes 57 and 59, a plurality of turnings is formed, as will hereinafter be described referred to one of the pipes (pipe 57) in detail. The pipe 57 extends to the same direction as the straight portion 53b from the connecting pipe 61 to provide a first straight portion 57a. And, following the first straight portion 57a, it extends to slightly outwardly, then in parallel with the first straight portion 57a to provide a second straight portion 57b. The second straight portion 57b is followed by a first loop shaped turning 57c, which bends outwardly back in hairpin shape. Then, the first loop shaped turning 57c is followed by a third straight portion 57d, which adjacently extends in parallel with the second straight portion 57b. The third straight portion 57d extends until the proximal of the second straight portion 57b, then bends outwardly back in semicircular shape to provide a first semicircular turning 57e. The first semicircular turning 57e is followed by a forth straight portion 57f, which extends in parallel with the second straight portion 57b and the third straight portion 57d. And, in the same manner, a second loop shaped turning 57g, a fifth straight portion 57h, a second semicircular turning 57i and a sixth straight portion 57j are provided. Then, the sixth straight portion 57j is followed by a curve 57k, which bends to perpendicular in ¼ circle shape. The distal end of the curve 57k is inserted into one terminal of a connection pipe 63.

Incidentally, another pipe 59 has a symmetrical structure with respect to the pipe 57.

As described above, the meandering turn portion 55 is provided with a total of nine turnings including four loop shaped turnings 57c, 57g, 59c and 59g, four semicircular turnings 57e, 57i 59e and 59i, and one turning formed by two curve 57k and 59k and the connection pipe 63. The meandering turn portion 55 has a length of 320 mm and a width of 87 mm. And, the capillary tube heat pipe 51 has a total length of 1300 mm, and a length between the ends of the semicircular turning and one turn portion is 980 mm.

Suppose that the meandering turn portion 55 acts as the heat receiving portion, and the one turn portion 53 acts as the heat radiating portion. In the heat receiving portion, the meandering turn portion 55 is contacted to a heat receiving plate 69 not with all surface area thereof but with only the left side (the side of the loop shaped turnings 57c and 57g, the side opposite to the one turn portion 53, referred as a L end portion 55L) thereof. The L-end portion 55L of the meandering turn portion 55 is secured to the heat receiving plate 69 by soldering. On the other hand, the right side (the side of the semicircular turnings 57i and 57e, referred as a R end portion 55R) of the meandering turn portion 55 is exposed in air. That is, the heat receiving portion (the meandering turn portion 55) is provided with a low temperature portion (the L-end portion 55L which is contacted to the heat receiving plate 69) and a high temperature portion (the R-end portion 55R which is exposed in air).

The heat pipe in FIG. 6 works so that heat can be transferred for long distance by increasing the flow force of the working fluid in the heat receiving portion. It will be explained in detail referring to FIG. 7 and FIG. 9.

Figure 7A:
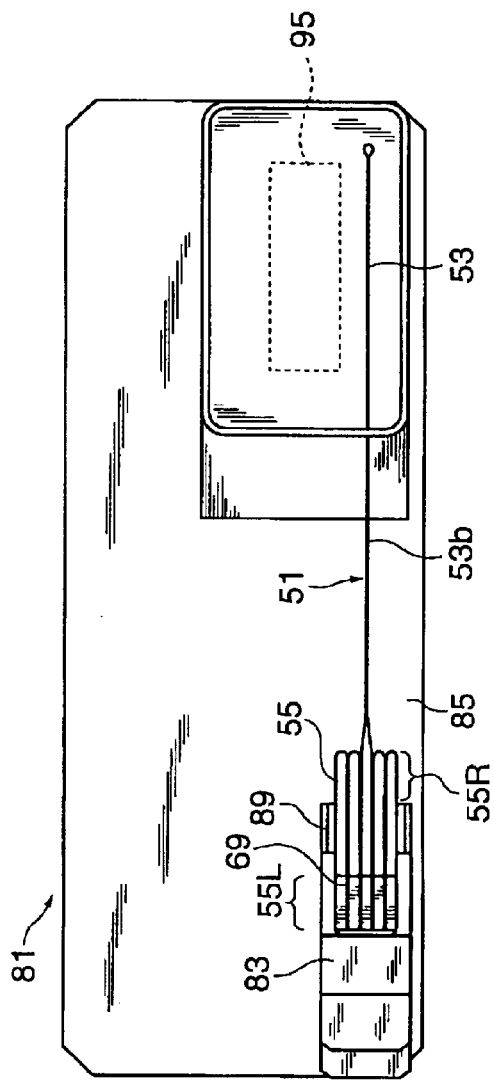
FIG. 7(A) is a plan view and FIG. 7(B) is a side view.
Figure 7B:
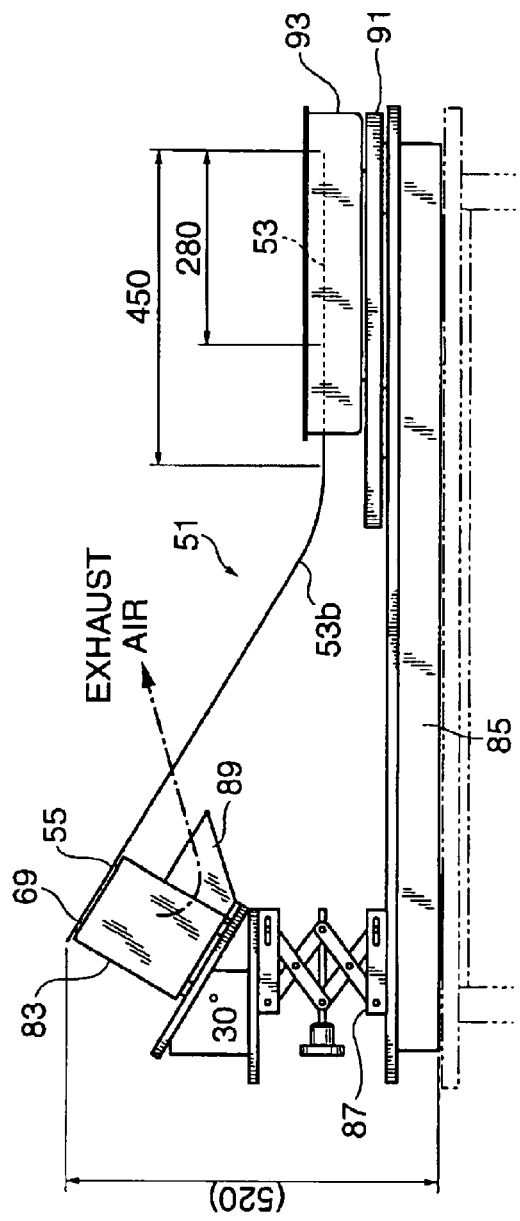

FIG. 7 is a drawing showing a structure of a temperature controlling apparatus according to the present invention as a cooling apparatus (a cold heat generating apparatus) and a cooling ability examination using the cooling apparatus, FIG. 7(A) is a plan view and FIG. 7(B) is a side view.

FIG. 8 is a side view showing a structure of a temperature controlling apparatus according to the present invention as a heating apparatus (a hot heat generating apparatus).

Figure 9:
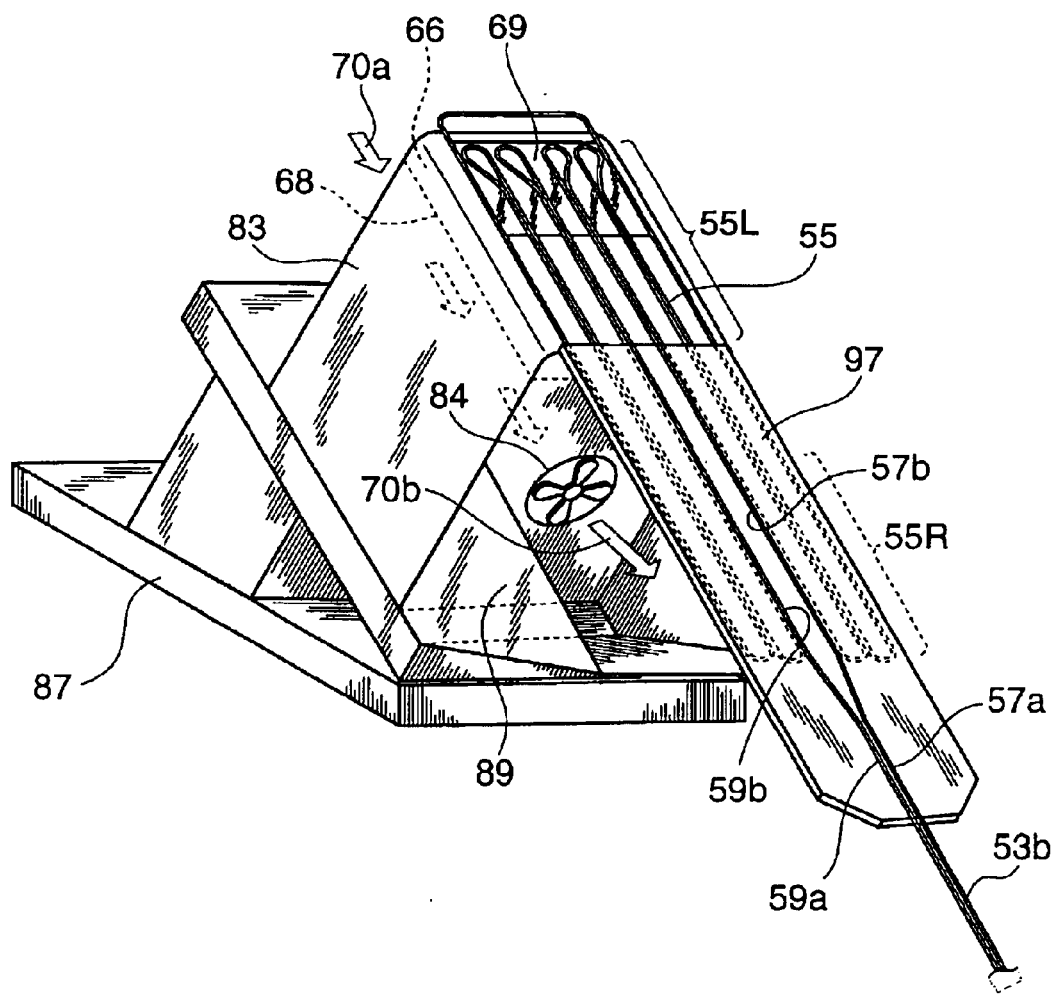
FIG. 9 is a drawing partially showing the structure of the cooling apparatus of FIG. 7.

FIG. 9 is a drawing partially showing the structure of the cooling apparatus of FIG. 7.

To evaluate the cooling ability of the temperature controlling apparatus 81 as shown in FIG. 7, cold heat produced by a Peltier unit 83 is transferred to a hot water in a stainless bat 93 by using the capillary tube heat pipe 51 in FIG. 6 while the water is kept to be heated by a heater 95. The capillary tube heat pipe 51 has a same structure and action as the capillary tube heat pipe of FIG. 6 and will not be explained in detail.

On one side of a table 85, a jack 87 is mounted, on which the Peltier unit 83 is placed. The Peltier unit 83 is tilted 30° to the horizontal direction on the jack 87, and an exhaust duct 89 of the Peltier unit 83 is located at a lower position in the tilt direction. Such configuration intends to arrange the heat pipe 51 in a bottom heat mode at which heat is easy to transfer (as described hereinafter in detail). From the exhaust duct 89, air is brown out after contacting with a heat radiating face of the Peltier unit 83. This phenomenon will be described in detail referred to FIG. 9.

The heat generating element of the Peltier unit 83 is a Peltier element having a plate shape. One surface of the Peltier element acts as a thermal working face (for instance, a cold heat generating surface) from which a desirable heat (in this case, cold heat) is generated, and the opposite surface acts as a counter thermal working face (for instance, a hot heat radiating surface). Suppose the case that this Peltier element produces a temperature difference of 45° C. between the cold heat generating surface and the hot heat radiating surface. For instance, when cold heat of −5° C. is produced from the thermal working face in the case that the Peltier element is used for a cold heat generator, hot heat of +40° C. is radiated from the counter thermal working face. Then, it is necessary to cool the counter thermal working face. On the contrary, when hot heat of +50° C. is produced from the thermal working surface in the case that the Peltier element is used for a hot heat generator, cold heat of +5° C. is radiated from the counter thermal working face. Then, it is necessary to heat the counter thermal working face.

In this embodiment of FIG. 9, the Peltier element is used for a cold heat generator. As shown in FIG. 9, the Peltier element 66, in which the upper surface acts as a cold heat generating surface and the lower (opposite) surface 68 acts as a hot heat radiating surface, is mounted along the upper plane of the Peltier unit 83. For cooling the hot heat radiating surface 68, a fan 84 for drawing room air into the Peltier unit 83 is provided. On driving the fan 84, the hot heat radiating surface 68 of the Peltier element 66 is exposed by the drawn room air to be cooled. The room air 70a drawn in the Peltier unit 83 is heated to the temperature beyond the room temperature by +2∼3° C. due to the radiated hot heat from the hot heat radiating surface 68. The heated air 70b is exhausted from the exhaust duct 89 of the Peltier unit 83. The exhausted air is used for improving a heat transfer capacity of the heat pipe 51, referred hereinafter.

The L-end portion 55L of the heat pipe 51 is so mounted to the Peltier unit 83 that the meandering turn portion 55 receives cold heat produced from the Peltier. unit 83. As described in detail, the heat receiving plate 69 to which the L-end portion 55L of the meandering turn portion 55 is secured is mounted to the upper plane (a cold heat generating surface of the Peltier element 66) of the Peltier unit 83 by screws to receive cold heat via the heat receiving plate 69. On the other hand, the R-end portion 55R of the meandering turn portion 55 is exposed in air, and is subjected to the exhausted air 70b from the exhaust duct 89, which is heated by the heat radiated from the hot heat radiating surface 68 of the Peltier element 66.

Therefore, a low temperature portion (L-end portion 55L) and a high temperature portion (R-end portion 55R) are formed in the meandering turn portion 55. As the result, the working fluid can flow actively in the meandering turn portion 55. Accordingly, by subjecting the R-end portion 55R of the meandering turn portion 55 to the heated air which is produced in association with the driving of the Peltier unit 83, the difference in the temperature between the L-end portion 55L and the R-end portion 55R becomes larger as compared with the case only receiving cold heat from the L-end portion 55L. Therefore, the working fluid can flow activity to be able to increase the booster effect. That is, the medium (air 70a and 70b) for radiating heat from the Peltier element is used as an assistant heat source for increasing the booster effect.

And, since the L-end portion 55L in low temperature is located higher than the R-end portion 55R in a high temperature, the heat receiving portion is arranged in the bottom heat mode at which heat is easy to transfer.

As shown in FIG. 7, on another side of the table 85, the stainless bat 93 is placed via a heat insulation material 91.

In the bat 93, water is stored and heated by the heater (for instance, power of 27 W) 95.

The capillary tube heat pipe 51 is arranged so as to downwardly tilt from the meandering turn portion 55 which is mounted on the Peltier unit 83, and to horizontally extend in parallel with the upper surface of the table 85, and then to be immersed into the water in the bat 93 at the part of the one turn portion 53. The left end of the meandering turn portion 55 is 520 mm height above the table 85. A length of the horizontally extending part of the pipe 51 is 450 mm, and a length of an effective heat exchange part (a part immersed into water) is 280 mm.

By the way, when the temperature controlling apparatus according to the present invention is used for a heating apparatus as shown in FIG. 8, the current direction for the Peltier unit is switched in reverse to the current direction for the Peltier unit of the cooling apparatus as shown in FIG. 7. Then, the upper surface of the Peltier element 66 acts as a hot heat generating surface while the lower surface thereof acts as a cold heat generating surface. And, the heat receiving plate 69 contacted to the L-end portion 55L of the meandering turn portion 55 of the heat pipe 51 is secured to the hot heat generating surface (the upper surface) of the Peltier element 66 while the R-end portion 55R is exposed in air. Hereby, a high temperature portion (the L-end portion 55L) and a low temperature portion (the R-end portion 55R) are formed in the meandering turn portion 55.

Further, in order to arrange the heat pipe in the bottom heat mode, the meandering turn portion 55 is tilted so that the L-end portion 55L having a high temperature is located lower than the R-end portion 55R having a low temperature. The tilt angle to the horizontally direction is 30°, for instance. Therefore, the heat pipe 51 is so arranged as to tilt upwardly to the one turn portion 53 from the meandering turn portion 55. Here, when the temperature controlling apparatus is used for the heating apparatus, air having cold heat is exhausted. Then, the exhaust duct 89 of the Peltier unit 83 is located in lower side to the tilt direction so that the R-end portion 55R of the meandering turn portion 55 is not subjected to the cold air exhausted from the Peltier unit 83, because the exhausted cold air may cause a decrease in the quantity of hot heat transferred to the heat pipe from the Peltier element.

For arrangement of the heat pipe 51 in the bottom heat mode, the Peltier unit 83 is tilted 30° to the horizontal direction of the jack 87 placed on the table 85. And, the stainless bat 93 in which water is stored is mounted on the table 85 via a heat isolating material 91 and a beam 92. The capillary tube heat pipe 51 is upwardly tilted from the meandering turn portion 55, and extends horizontally in parallel with the upper surface of the table 85, and then to be immersed into the water in the bat 93 at the part of the one turn portion 53. This temperature controlling apparatus is used for raising the temperature of the water in the bat 93.

Next, the action of the heat pipe in the temperature controlling apparatus will be wholly explained referring to the case that the temperature controlling apparatus is used for a cooling apparatus referring to FIG. 7 and FIG. 9.

On driving the Peltier unit 83, in the meandering turn portion 55, the L-end portion 55L receives cold heat and causes the working fluid in the pipe to be condensed, while the R-end portion 55R is heated by the circumference air and causes the working fluid in the pipe to be evaporated. Since the distance between the L-end portion 55L and the R-end portion 55R is relatively small, the working fluid flows actively in association with such condensation and evaporation of the working fluid. Because the meandering capillary tube heat pipe 51 forms one closed loop, when the flow force of the working fluid in the meandering turn portion 55 is increased, the flow force is transmitted to the working fluid in the straight portion 53b, which extends from the meandering turn portion 55 to the one turn portion 53 (booster effect). Accordingly, a flow force capable of flowing the working fluid from the meandering turn portion 55 to the one turn portion 53 even though the both portions are separated by a long distance can be obtained. By using this heat pipe, a heat transferable distance can be lengthened to about 2000 mm. (This fact is already substantiated by another experiment).

Incidentally, the larger the number of the going and returning passages of the working fluid in the heat receiving portion or the heat radiating portion is, that is, the larger the number of turning is, the larger the flow force of the working fluid is, thus increasing the heat transfer capacity, which is a same result as a standard meandering capillary tube heat pipe.

Next, the result of the cooling examination using the cooling apparatus as shown in FIG. 7 will be explained.

The volume of water is set to 5 liter, and the water temperature at the experiment start time is set to 37°. This examination is carried out for the purpose of cooling the water to 32° while the water being heated by using the heater. The power of the Peltier unit is 40 W.

And, in order to improve the flow force of the working fluid, as shown in FIG. 9, a shielding plate 97 is provided in the R-end portion 55R of the meandering turn portion 55 so that the heat transfer portion 53b (including the center two straight portions 57b and 59b) is not subjected to the hot air exhausted from the exhaust duct 89. The shielding plate 97 prevents the cold heat produced from the Peltier unit 83 from being heated by the exhausted hot air in the heat transfer portion 53b. Accordingly, the cold heat produced from the Peltier unit can be transferred to the water in the bat 93 without decrease in temperature due to the exhausted hot air.

Figure 10:
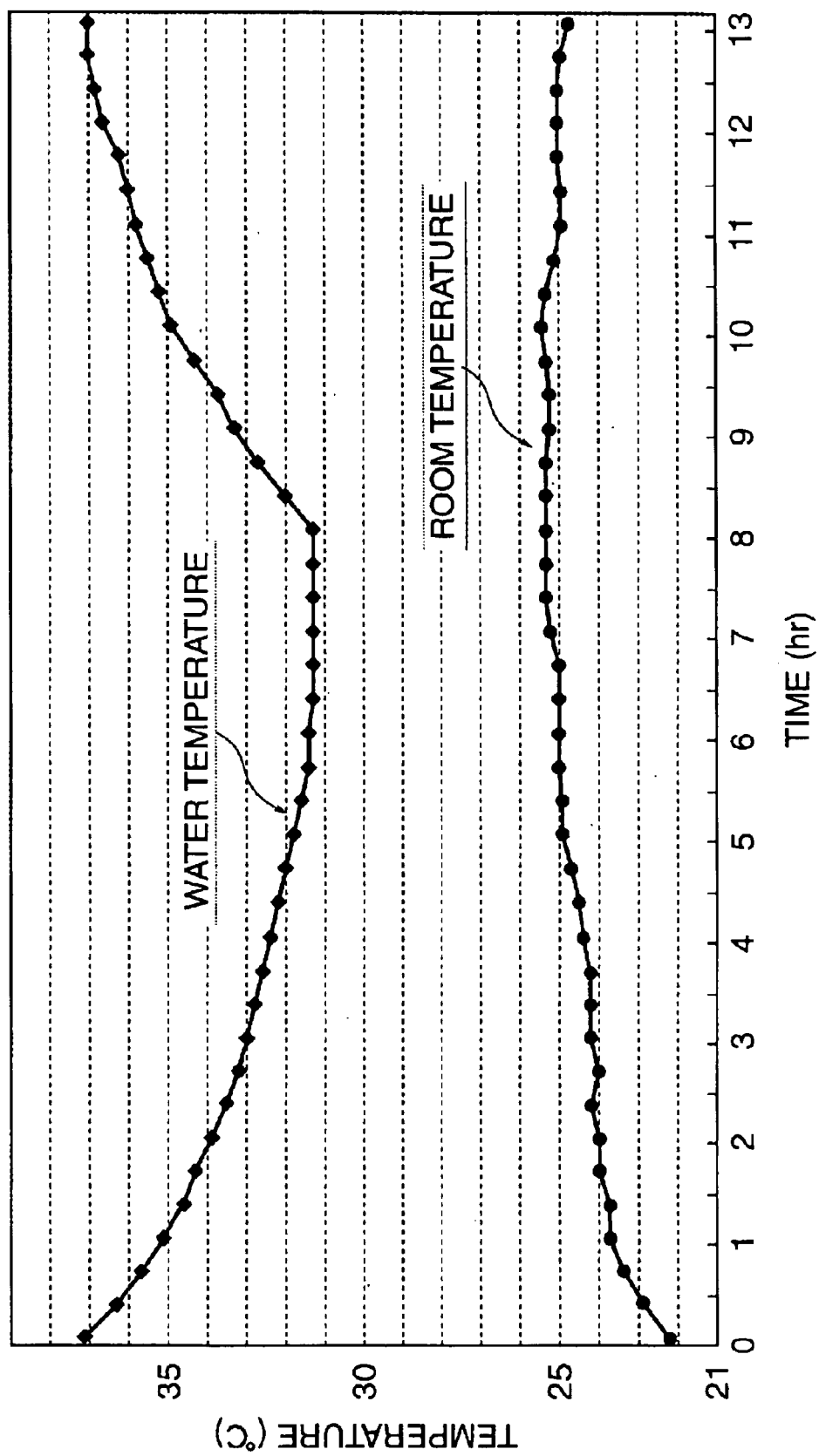
FIG. 10 is a graph showing a result of the cooling examination using the cooling apparatus of FIG. 7.
Figure 11:
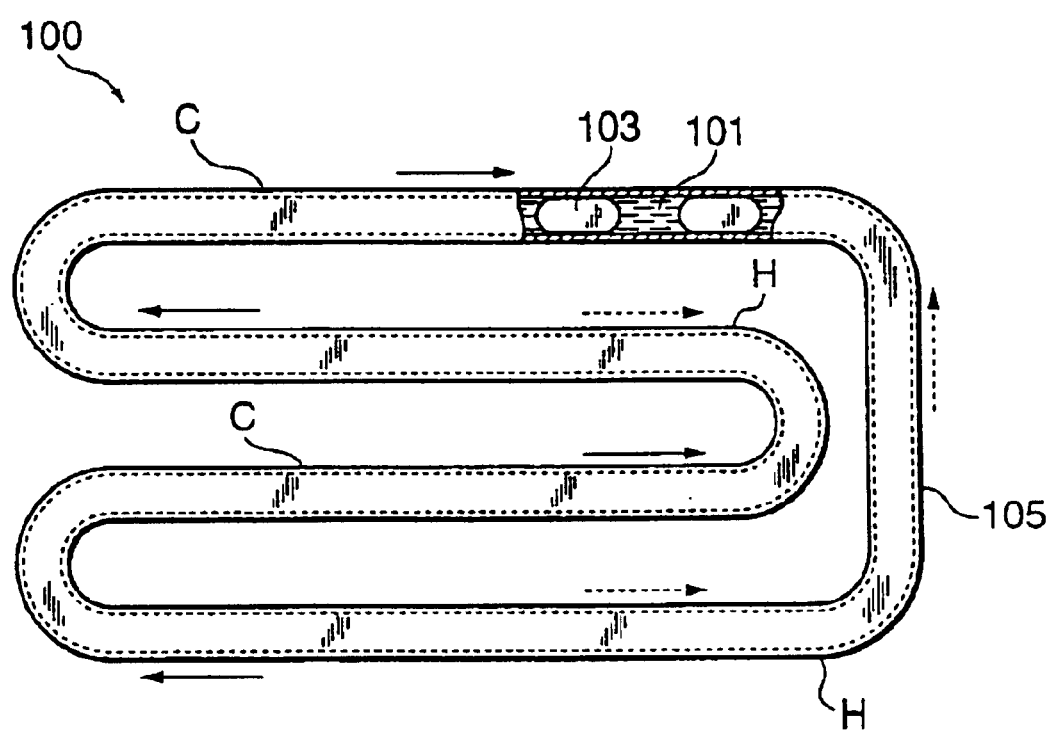
FIG. 11 is a partially cross sectional plan view showing a structure of a meandering capillary tube heat pipe disclosed in Japanese Laid-open Patent Publication No. Hei 4 (1992)-190090.

FIG. 10 is a graph showing a result of the cooling experiment using the cooling apparatus of FIG. 7.

The ordinate axis shows a temperature, and the abscissa axis shows a time. And, ♦ shows a temperature of water in the bat, and ● shows a room temperature.

Firstly, the water in the bat 93 is heated to 37.1° C. by the heater, and the Peltier unit is driven in advance. Then, the one turn portion 53 is immersed in the water at the experiment start time, and is pulled up from water when the temperature of the water is saturated after eight hours from the experiment start time.

As understood from the graph, the water temperature is gradually decreased from the experiment start time, and down to 31.3° C. after about six hours. And, kept the temperature last about two hours before the experiment stop time (the time at which the one turn portion 53 is pulled up from the water). The heater 95 is kept to being powered during thirteen hours from the experiment start time to the stop time. Therefore, after pulling up the one turn portion 53 from the water, the water temperature begins to rise toward to 37° C. of the initial temperature.

A cooling capacity in average during the experiment is, $$5000 \text{ g} \times 1 \text{ cal/g} \cdot ^\circ\text{C.} \times (37.1^\circ \text{C.} - 31.3^\circ \text{C.})/(6 \text{ hr} \times 860 \text{ cal/hr}) = 5.6 \text{ W.}$$

As understood from graph in FIG. 10, the decreasing gradient of the water temperature is large (that is, the cooling ability is large) in first one hour after the experiment start time. That is to say, the water temperature is decreased by 2° C. in the first one hour. The cooling ability in the first one hour is, $$5000 \text{ g} \times 1 \text{ cal/g·°C.} \times (37.1° \text{C.} - 35.1° \text{C.})/(1 \text{ hr} \times 860 \text{ cal/hr}) = 11.6 \text{ W.}$$

The reason why the decreasing gradient of the water temperature is large in the first one hour after the experiment start time is thought because the cold heat stored in the Peltier unit 83 and the heat receiving plate 69 is radiated at the experiment start time.

EFFECT OF THE INVENTION

The present invention, as described above, provides a capillary tube heat pipe, in which a heat transfer portion is formed by one pair of going and returning passages so as to be applied for a object in which a high temperature portion (a heat receiving portion) is separated apart from a low temperature portion (a heat radiating portion), and a sufficient space for connecting the both portions does not exist. And, largeer heat transfer capacity can be obtained by increasing the number of turnings in the heat receiving portion and/or the heat radiating portion.

What is claimed is:

1. A capillary tube heat pipe having a heat receiving portion, a heat radiating portion and a heat transfer portion connecting said heat receiving portion and said heat radiating portion, the capillary tube heat pipe comprising:

a capillary tube which forms a closed loop;

wherein the capillary tube has an inner diameter which is less than a maximum diameter which enables the working fluid to circulate in the capillary tube while being sealed inside the capillary tube;

wherein said heat transfer portion is constructed from only one pair of going and returning passages;

wherein the working fluid is capable of alternately flowing in a forward direction and a reverse direction within the capillary tube; and wherein the heat receiving portion and heat radiating portion comprise a high heat conductive material, and the heat transfer portion comprises a low heat conductive material.

2. The capillary tube heat pipe according to claim 1, wherein said heat receiving portion and/or said heat radiating portion comprises a meandering capillary tube (a meandering turn portion) having a plurality of turnings.

3. The capillary tube heat pipe according to claim 2, wherein said meandering turn portion is heated or cooled at one turn end side and is cooled or heated at another turn end side so as to cause a working fluid in said meandering turn portion to be evaporated and condensed, thereby increasing a flow force of the working fluid in said meandering turn portion.

4. The capillary tube heat pipe according to claim 1, wherein at said heat receiving portion and/or said heat radiating portion, a high heat conductive member (a boss) which transmits heat conduction between the capillary tube and an object to be heated or an object to be cooled is mounted, and wherein said boss includes a groove in which the capillary tube of said heat receiving portion and/or said heat radiating portion is embedded.

5. The capillary tube heat pipe according to claim 2, wherein at said heat receiving portion and/or said heat radiating portion, a high heat conductive member (a boss) which transmits heat conduction between the capillary tube and an object to be heated or an object to be cooled is mounted, and said boss includes a groove in which the capillary tube of said heat receiving portion and/or said heat radiating portion is embedded.

6. The capillary tube heat pipe according to claim 3, wherein at said heat receiving portion and/or said heat radiating portion, a high heat conductive member (a boss) which transmits heat conduction between the capillary tube and an object to be heated or an object to be cooled is mounted, and said boss includes a groove in which the capillary tube of said heat receiving portion and/or said heat radiating portion is embedded.

7. The capillary tube heat pipe according to claim 1, wherein an inner diameter of the capillary tube of said meandering turn portion which constructs said heat radiating portion and/or said heat receiving portion is larger than that of said heat transfer portion.

8. The capillary tube heat pipe according to claim 7, wherein capillary tubes of said heat transfer portion are inserted into capillary tubes of said meandering turn portion.

9. The capillary tube heat pipe according to claim 7, wherein capillary tubes of said meandering turn portion are substantially bent into a circle.

10. The capillary tube heat pipe according to claim 9, wherein capillary tubes of said meandering turn portion are substantially bent into a circle having a diameter larger than a distance between said one pair of going and returning passages of said heat transfer portion.

11. The capillary tube heat pipe according to claim 2, wherein a width of each of the plurality of turnings of the capillary tube is larger than a width of a straight portion of the capillary tube.

12. A temperature controlling apparatus comprising a cold heat or a hot heat generating device (a heat generating device) such as a Peltier unit and a capillary tube heat pipe arranged between said heat generating device and an object to be cooled or an object to be heated, wherein said capillary tube heat pipe includes a heat receiving portion connected to said heat generating device, a heat radiating portion connected to said object to be cooled or said object to be heated, and a heat transfer portion connecting said heat receiving portion and said heat radiating portion, and the capillary tube heat pipe comprising a capillary tube which forms a closed loop;

wherein the capillary tube has an inner diameter which is less than a maximum diameter which enables the working fluid to circulate in the capillary tube while being sealed inside the capillary tube;

wherein said heat transfer portion is constructed from only one pair of going and returning passages;

wherein the working fluid is capable of alternately flowing in a forward direction and a reverse direction within the capillary tube; and wherein the heat receiving portion and heat radiating portion comprise a high heat conductive material, and the heat transfer portion comprises a low heat conductive material.

13. The temperature controlling apparatus according to claim 12, wherein said heat receiving portion and/or said heat radiating portion comprises a meandering capillary tube (a meandering turn portion) having a plurality of turnings.

14. The temperature controlling apparatus according to claim 13, wherein said meandering turn portion is cooled or heated at one turn end side by said heat generating device, and is heated or cooled at another turn end side by circumference air and/or by medium (for instance, air) for radiating heat produced by a heat generating element of said heat generating device.

15. The temperature controlling apparatus according to claim 13, wherein a width of each of the plurality of turnings of the capillary tube is larger than a width of a straight portion of the capillary tube.

16. A capillary tube heat pipe having a heat receiving portion, a heat radiating portion and a heat transfer portion connecting said heat receiving portion and said heat radiating portion, the capillary tube heat pipe comprising:

a capillary tube which forms a closed loop;

wherein said heat transfer portion is constructed from only one pair of going and returning passages;

wherein said heat receiving portion and/or said heat radiating portion comprises a meandering capillary tube (a meandering turn portion) having a plurality of turnings;

wherein said meandering turn portion is heated or cooled at one turn end side and is cooled or heated at another turn end side so as to cause a working fluid in said meandering turn portion to be evaporated and condensed, thereby increasing a flow force of the working fluid in said meandering turn portion;

wherein the working fluid is capable of alternately flowing in a forward direction and a reverse direction within the capillary tube; and wherein the heat receiving portion and heat radiating portion comprise a high heat conductive material, and the heat transfer portion comprises a low heat conductive material.

17. The capillary tube heat pipe according to claim 16, wherein at said heat receiving portion and/or said heat radiating portion, a high heat conductive member (a boss) which transmits heat conduction between the capillary tube and an object to be heated or an object to be cooled is mounted, and said boss includes a groove in which the capillary tube of said heat receiving portion and/or said heat radiating portion is embedded.

18. The capillary tube heat pipe according to claim 16, wherein a width of each of the plurality of turnings of the capillary tube is larger than a width of a straight portion of the capillary tube.

19. The temperature controlling apparatus of claim 16, wherein a width of each of the plurality of turnings of the capillary tube is larger than a width of a straight portion of a straight portion of the capillary tube.

20. A temperature controlling apparatus comprising a cold heat or a hot heat generating device (a heat generating device) such as a Peltier unit and a capillary tube heat pipe arranged between said heat generating device and an object to be cooled or an object to be heated, wherein said capillary tube heat pipe includes a heat receiving portion connected to said heat generating device, a heat radiating portion connected to said object to be cooled or said object to be heated, and a heat transfer portion connecting said heat receiving portion and said heat radiating portion, and the capillary tube heat pipe comprising a capillary tube which forms a closed loop, wherein said heat transfer portion is constructed from only one pair of going and returning passages;

wherein said heat receiving portion and/or said heat radiating portion comprises a meandering capillary tube (a meandering turn portion) having a plurality of turnings;

wherein said meandering turn portion is heated or cooled at one turn end side and is cooled or heated at another turn end side so as to cause a working fluid in said meandering turn portion to be evaporated and condensed, thereby increasing a flow force of the working fluid in said meandering turn portion;

wherein the working fluid is capable of alternately flowing in a forward direction and a reverse direction within the capillary tube; and wherein the heat receiving portion and heat radiating portion comprise a high heat conductive material, and the heat transfer portion comprises a low heat conductive material.

21. The temperature controlling apparatus according to claim 20, wherein said heat receiving portion and/or said heat radiating portion comprises a meandering capillary tube (a meandering turn portion) having a plurality of turnings.

22. The temperature controlling apparatus according to claim 21, wherein said meandering turn portion is cooled or heated at one turn end side by said heat generating device, and is heated or cooled at another turn end side by circumference air and/or by medium (for instance, air) for radiating heat produced by a heat generating element of said heat generating device.

23. The capillary tube heat pipe according to claim 16, wherein at said heat receiving portion and/or said heat radiating portion, a high heat conductive member (a boss) which transmits heat conduction between the capillary tube and an object to be heated or an object to be cooled is mounted, and said boss includes a groove in which the capillary tube of said heat receiving portion and/or said heat radiating portion is embedded.

24. The capillary tube heat pipe according to claim 16, wherein at said heat receiving portion and/or said heat radiating portion, a high heat conductive member (a boss) which transmits heat conduction between the capillary tube and an object to be heated or an object to be cooled is mounted, and said boss includes a groove in which the capillary tube of said heat receiving portion and/or said heat radiating portion is embedded.

25. The capillary tube heat pipe according to claim 16, wherein an inner diameter of the capillary tube of said meandering turn portion which constructs said heat radiating portion and/or said heat receiving portion is larger than that of said heat transfer portion.

26. The capillary tube heat pipe according to claim 25, wherein capillary tubes of said heat transfer portion are inserted into capillary tubes of said meandering turn portion.

27. The capillary tube heat pipe according to claim 25, wherein capillary tubes of said meandering turn portion are substantially bent into a circle.

28. The capillary tube heat pipe according to claim 27, wherein capillary tubes of said meandering turn portion are substantially bent into a circle having a diameter larger than a distance between said one pair of going and returning passages of said heat transfer portion.

* * * * *